(12) United States Patent
Kondo

(10) Patent No.: US 6,469,903 B1
(45) Date of Patent: Oct. 22, 2002

(54) FLEXIBLE PRINTED CIRCUIT AND SEMICONDUCTOR DEVICE

(75) Inventor: Yoichiro Kondo, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/678,474

(22) Filed: Oct. 2, 2000

(30) Foreign Application Priority Data

Oct. 1, 1999 (JP) .......................................... 11-282163

(51) Int. Cl.$^7$ ................................................ H05K 1/14
(52) U.S. Cl. ........................ 361/749; 174/254; 174/268
(58) Field of Search ................................ 361/749–751, 361/752, 758; 174/254, 268; 439/493

(56) References Cited

U.S. PATENT DOCUMENTS

| | | | | |
|---|---|---|---|---|
| 4,928,206 A | * | 5/1990 | Porter et al. ................ | 361/385 |
| 5,224,023 A | * | 6/1993 | Smith et al. ................ | 361/412 |
| 5,754,409 A | * | 5/1998 | Smith .......................... | 361/803 |
| 5,789,815 A | * | 8/1998 | Tessier et al. .............. | 257/723 |
| 5,995,370 A | * | 11/1999 | Nakamori ................... | 361/704 |
| 6,208,521 B1 | * | 3/2001 | Nakatsuka .................. | 361/749 |

* cited by examiner

Primary Examiner—David Martin
Assistant Examiner—Dameon E. Levi
(74) Attorney, Agent, or Firm—Hogan & Hartson, LLP

(57) ABSTRACT

A semiconductor device of the present invention comprises a flexible printed circuit having a first area part located in the center thereof, a second area part provided continuous thereto, and a third area part provided continuous to the first area part; a wiring pattern formed on a surface of the above-described flexible printed circuit; a semiconductor element mounted on a surface of the second area part; and a second semiconductor element mounted on a surface of the third area part, wherein the second area part is folded to a face side of a center area part, and the third area part is folded to a rear side of the second area part.

7 Claims, 4 Drawing Sheets

FLEXIBLE PRINTED CIRCUIT AND SEMICONDUCTOR DEVICE

BACKGROUND OF THE INVENTION

1. Field of the Invention

The present invention relates to a flexible printed circuit on a surface of which a wiring pattern is formed, and a semiconductor device using it.

2. Description of the Related Art

FIG. 6 is a schematic representation of an example of a prior art semiconductor device. This semiconductor device has a main substrate 101, and first and second multi chip modules (hereinafter, referred to as "MCM") 103, 105 are electrically connected to this main substrate 101 by connecting methods such as a leadless chip carrier and BGA (ball grid array).

In the first and second MCMs 103, 105, a plurality of IC chips (not shown in the figure) are COB(chip on board)-mounted on a circuit substrate (not shown in the figure). The COB mounting is a mounting method in which a bare chip is directly mounted on the substrate, an electrode of a bare chip is connected to an electrode of a substrate through a wire, and the chip is over-coated by a resin.

SUMMARY OF THE INVENTION

Hitherto, the MCM in which a plurality of IC chips are COB-mounted on the circuit substrate is used in the above-described prior art semiconductor device, and the mounting area is increased as the number of IC chips to be mounted is increased, and the size of the MCMs 103, 105 is also increased. The increase in the mounting area causes a trouble in reducing the size of an electronic product provided with the above-described semiconductor device.

The first and second MCMs 103, 105 are solder-mounted on the main substrate 101 by the BGA or the chip carrier. Such an MCM is disadvantageous in that the re-workability from the main substrate 101 is poor. Re-work means a work to mount the MCM on the main substrate after the MCM is detached from the main substrate for repairs, etc.

The present invention is achieved considering the above-described circumstances, and an object thereof is to provide a flexible printed circuit and a semiconductor device in which the mounting area can be considerably reduced when a plurality of semiconductor elements are mounted. Another object of the present invention is to provide the flexible printed circuit and the semiconductor device excellent in re-workability.

To solve the above-described problems, the flexible printed circuit of the present invention has a wiring pattern formed on the face side thereof, and is characterized to comprise a first area part, a second area part which is provided continuous to the first area part, folded to the first area part side, and has at least one electronic parts mounted thereon, and a third area part which is provided continuous to the first area part and folded to the second area part side.

The above-described flexible printed circuit has the second area part on which at least one electronic parts is mounted, the second area part is folded to the first area part side, and the third area part is folded to the second area part side. The mounting area can thus be considerably reduced compared with a prior art multi chip module using a substrate which cannot be folded. The electronic parts here are a generic term of semiconductor elements and peripheral elements.

The flexible printed circuit of the present invention preferably includes a connector terminal which is provided continuous to the first area part and connected to a main substrate. The multi chip module can thus be easily attached/detached to/from the main substrate, and the re-workability can be improved.

The flexible printed circuit of the present invention has an area on which an external terminal is provided on a rear side of the first area part.

The semiconductor device of the present invention comprises the flexible printed circuit having the first area part, the second area part provided continuous thereto, and the third area part provided continuous to the first area part, a wiring pattern formed on a face side of the above-described flexible printed circuit, and an electronic parts mounted on at least one of the face side of the second area part and the third area part, wherein the second area part is folded to the face side of the first area part, and the third area part is folded to a rear side of the second area part.

In the above-described semiconductor device, the electronic parts is mounted on at least one face side of the second and third area parts of the flexible printed circuit, and since the flexible printed circuit is folded, the mounting area can be considerably reduced compared with the semiconductor device using a prior art substrate which cannot be folded.

The semiconductor device of the present invention preferably further includes the peripheral element mounted on at least one face side of the second and third area parts. The electric characteristics of the module can be optimized. The peripheral element includes a chip capacitor, a chip resistor and a quartz.

The semiconductor device of the present invention preferably further comprises a connector terminal which is provided continuous to the first area part and connected to the main substrate. The semiconductor device can be easily attached/detached to/from the main substrate thereby, and the re-workability thereof can be improved.

The semiconductor device of the present invention further includes an external terminal provided on a rear side of the first area part.

In the semiconductor device of the present invention, it is preferable that the face side of the first area part is fixed to the face side of the second area part by an adhesive material, and the rear side of the second area part is fixed to the face side of the third area part by an adhesive material.

In the semiconductor device of the present invention, at least one of the second and third area parts is provided with a folded portion folded to a face side of the first area part, and the peripheral element is disposed on the folded portion.

It is to be understood that both the foregoing general description and the following detailed description are exemplary and explanatory and are intended to provide further explanation of the invention as claimed.

DETAILED DESCRIPTION OF THE PREFERRED EMBODIMENTS

The embodiment of the present invention will be described below with reference to the drawings.

Figure 1A:
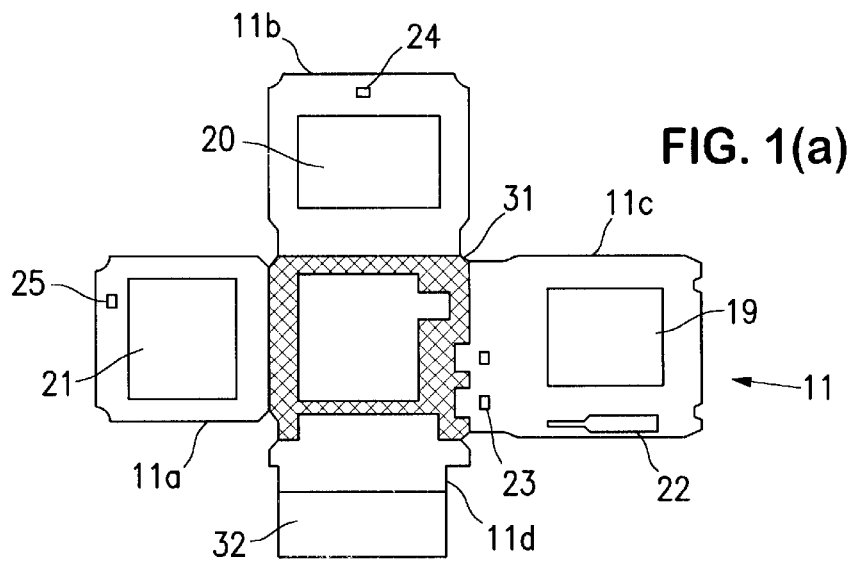
FIG. 1 is a top plan view showing the procedure to manufacture a semiconductor device of a first embodiment of the present invention.
Figure 1B:
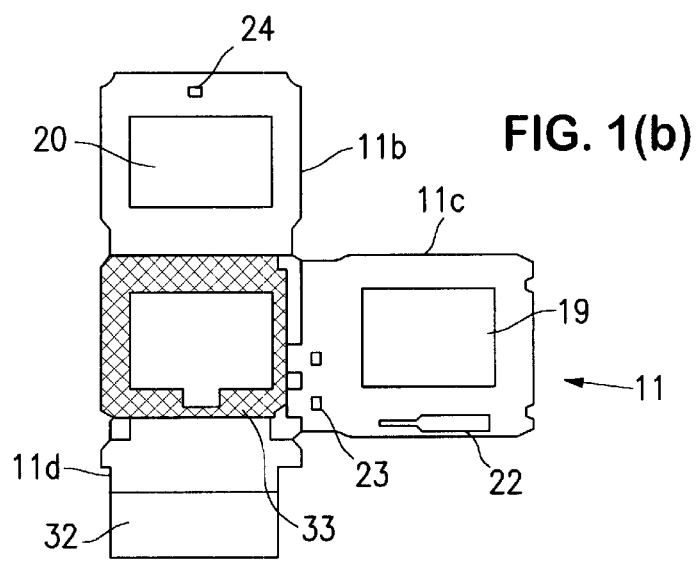
Figure 1C:
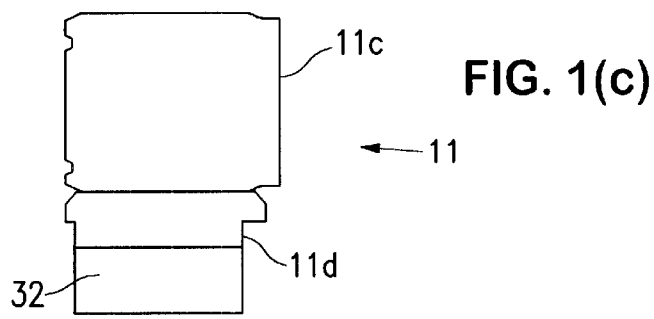
Figure 2:
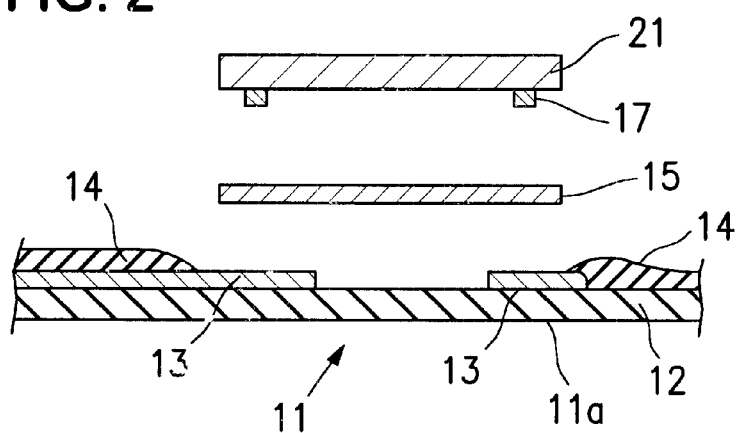
FIG. 2 is a sectional view describing a method to mount a semiconductor element on a flexible printed circuit shown in FIG. 1.
Figure 3:
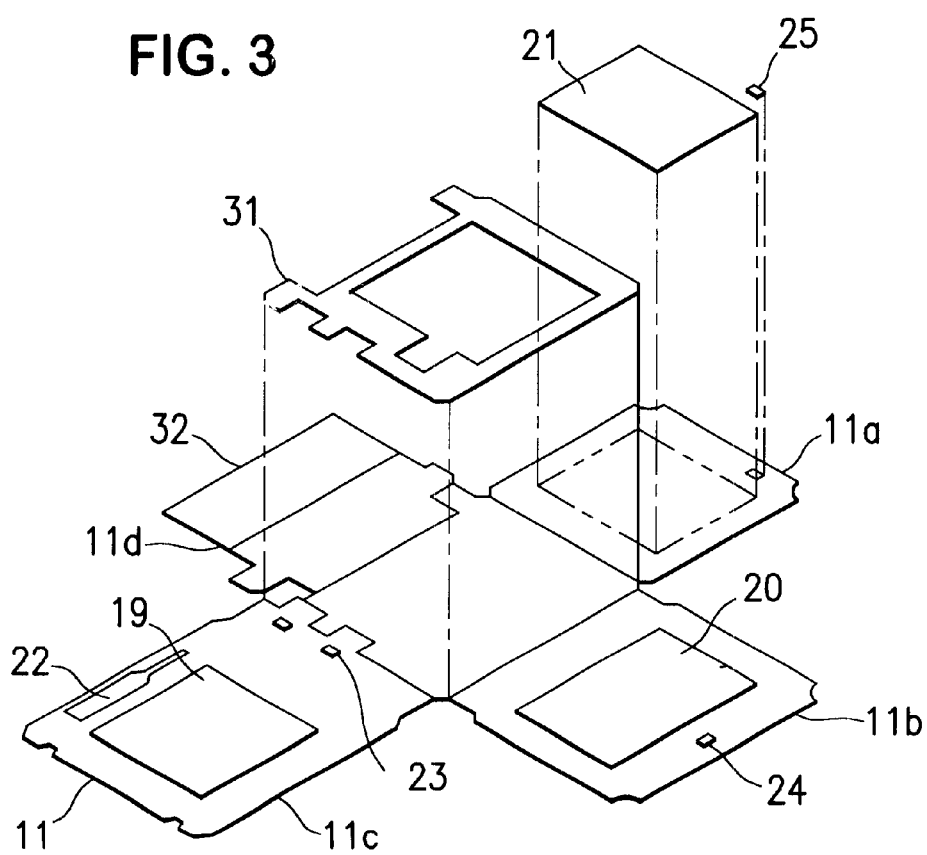
FIG. 3 is a perspective view showing a procedure to dispose a semiconductor element and a space on a flexible printed circuit.

FIGS. 1(a)–(c) are a top plan view to indicate a procedure for manufacturing a semiconductor device of a first embodiment of the present invention. FIG. 2 is a sectional view to describe a method for mounting a semiconductor element on a flexible printed circuit shown in FIG. 1. FIG. 3 is a perspective view to indicate a procedure for disposing a semiconductor element and a spacer on the flexible printed circuit.

Firstly, as shown in FIG. 1(a), a flexible printed circuit (hereinafter, referred to as an "FPC") 11 which is formed freely foldable is prepared. This FPC 11 is cruciform in plan view, and formed of a soft material which can be easily folded like a polyimide.

This means that the FPC 11 has a substantially rectangular first area part having four sides, and the first area part is located in a center area of the FPC 11. A second area part 11a is continuously provided on the first side (a left side) of this first area part. A substantially rectangular third area part 11b is continuously provided on a second side (an upper side) of the first area part, a substantially rectangular fourth area part 11c is continuously provided on a third side (a right side) of the first area part, and a substantially rectangular fifth area part 11d is continuously provided on a fourth side (a lower side) of the first area part. This FPC 11 has a polyimide film 12 as shown in FIG. 2. A wiring pattern 13 is formed on a face side and a rear side of this polyimide film 12, and a solder resist 14 is applied to the polyimide film 12 around this wiring pattern 13. The wiring pattern on the face side and the wiring pattern on the rear side of the polyimide film 12 are electrically connected to each other via a through hole 43 (refer to FIG. 5) or the like.

Then, first to third semiconductor elements 21, 20 and 19 and first to fourth peripheral elements 25, 24, 22 and 23 are prepared. The first semiconductor element 21 has a bump electrode 17 on a surface of a chip as shown in FIG. 2. The second and third semiconductor element 20 and 19 also similarly have a bump electrode. The first and second semiconductor elements 21 and 20 are formed of, for example, an SRAM (static random access read write memory), and the third semiconductor element 19 is formed of, for example, an MCU (micro control unit). Further, the first, second and fourth peripheral elements 25, 24 and 23 are formed of a chip element, for example, a chip capacitor, a chip resistor and a quartz, and the third peripheral element 22 is formed of, for example, a quartz.

Then, as shown in FIG. 3, a first semiconductor element (SRAM) 21 is COF (chip on film) mounted on the second area part 11a of this FPC 11. The COF mounting means a method for mounting a chip on a film through a facedown bonding. This means that, for example, an anisotropic conductive film (ACF) 15 is placed on a specified position on the second area part 11a of the FPC 11. This ACF 15 has conductive particles (not shown in the figure), and the conductive particles are pressed and squeezed between a bump 17 and the wiring pattern 13 by heating and pressing the first semiconductor element 21 in a face-down manner, and the bump 17 and the wiring pattern 13 are electrically connected to each other. In the ACF 15, the conductive particles (conductive filler) are dispersed in a binder, and in some cases, a dispersant may be added thereto. A thermosetting binder is often used for the binder of the ACF 15.

Then, the second semiconductor element (SRAM) 20 is COF-mounted on the third area part 11b of the FPC 11, and the third semiconductor element (MCU) is COF-mounted on the fourth area part 11c of the FPC 11.

Next, the first peripheral element 25 is mounted by soldering on the second area part 11a of the FPC 11, the second peripheral element 24 is mounted by soldering on the third area part of the FPC 11, and the third and fourth peripheral elements 22 and 23 are mounted by soldering on the fourth area part 11c of the FPC 11.

Then, a connector terminal 32 is mounted on a tip side of the fifth area part 11d of the FPC 11. For example, a pattern is formed in advance on the tip side of the fifth area part 11d as a connector terminal. A general connector for FPC on the market is used for the connector terminal on a reception side on a main substrate (a mounting substrate).

Then, a first spacer 31 open in a center portion thereof is attached on the first area part of the FPC 11. A notch or a recess is formed around the first spacer 31. The FPC 11 shown in FIG. 1(a) with semiconductor elements or the like mounted thereon.

Figure 5:
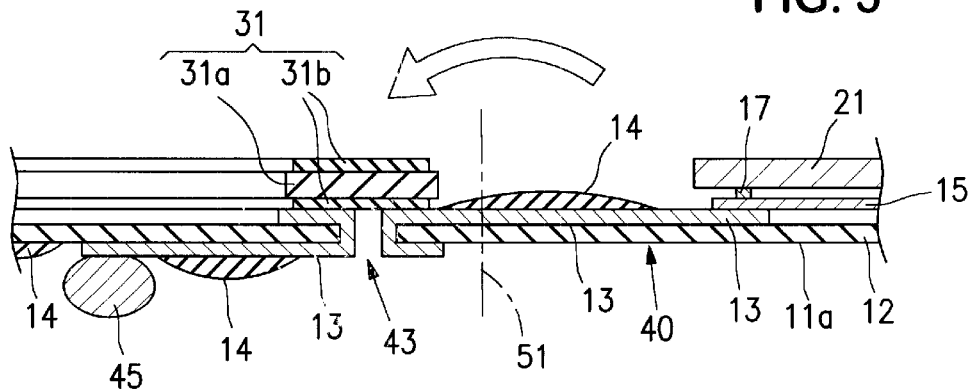
FIG. 5 is a sectional view at the line 5—5 in FIG. 4(a).
Figure 6:
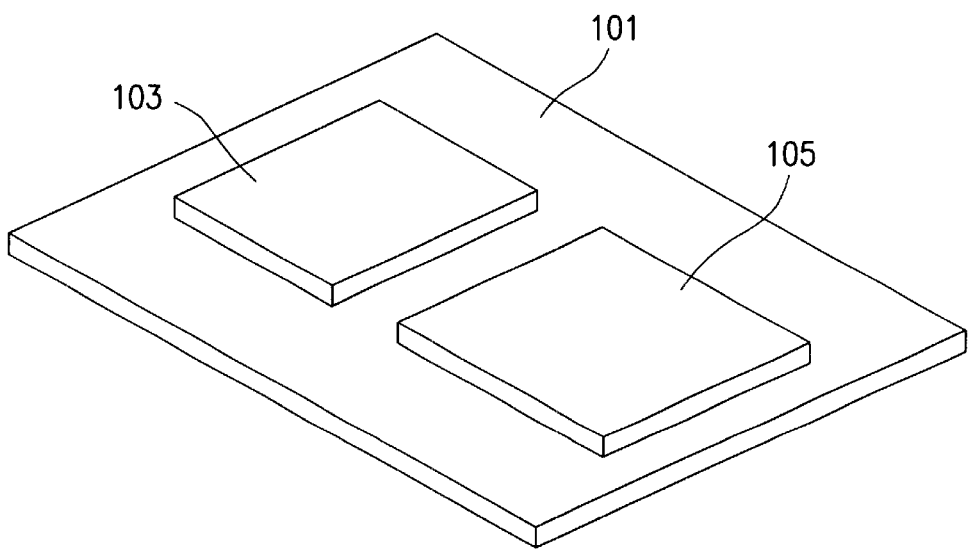
FIG. 6 is a schematic representation of an example of a prior art semiconductor device.

The opening part of the first spacer 31 is approximately of the size that the first semiconductor element 21 and the first peripheral element 25 are stored when the second area part 11a of the FPC 11 is folded to the first area part side along the first side. The notch or the recess in the first spacer 31 is disposed so that the peripheral element 23 is erected from the folded portion when the fourth area part 11c of the FPC 11 is folded to the third area part 11b side along the third side, and of the size and the shape that the peripheral element 23 can be inserted in the notch or the recess. In the first spacer 31, an adhesive material (for example, a pressure sensitive adhesive double coated tape) 31b is adhered to an upper surface and a lower surface of a base material 31a such as a glass epoxy substrate as shown in FIG. 5. The spacer 31 is substantially as high as the semiconductor element 21 mounted on the FPC.

Then, as shown in FIG. 1(b), the second area part 11a of the FPC 11 is folded to the first area part side along the first side, and the second area part 11a is attached to the first area part by the adhesive material of the first spacer 31. In this condition, the first semiconductor element 21 and the first peripheral element 25 are stored in the opening part of the first opening part.

Then, a second spacer 33 opened in a center portion thereof is attached to a rear side of the second area part 11a of the FPC 11. An opening part of the second spacer 33 is substantially of the size that the second semiconductor element 20 and the second peripheral element 24 are stored when the third area part 11b of the FPC 11 is folded to the rear side of the second area part 11a along the second side. In the second spacer 33, an adhesive material is attached to the base material such as a glass epoxy substrate similar to the first spacer 31. The spacer 33 is substantially as high as the semiconductor element 20 mounted on the FPC.

Then, as shown in FIG. 1(c), the third area part 11b of the FPC 11 is folded to a rear side of the second area part 11a along the second side, and the third area part 11b is attached to the rear side of the second area part 11a by the adhesive material of the second spacer 33. The second semiconductor element 20 and he second peripheral element 24 are stored in the opening part of the second spacer 33.

Then, a third spacer (not shown in the figure) opened in a center portion thereof is attached to a rear side of the third area part 11b of the FPC 11. An opening part of the third spacer is substantially of the size that the third semiconductor element 19 is stored when the fourth area part 11c of the FPC 11 is folded to a rear side of the third area part 11b along the third side. A notch is provided in the third spacer. This notch has the size and the shape that the peripheral element 22 can be substantially inserted when the fourth area part 11c is folded to the rear side of the third area part 11b. Also, in the third spacer, an adhesive material is attached to a base material such as a glass epoxy substrate similar to the first spacer 31. The third spacer is substantially as high as the semiconductor element 19 mounted on the FPC.

The fourth area part 11c of the FPC 11 is folded to the rear area side of the third area part 11b along the third side, and the fourth area part 11c is attached to the rear side of the third area part 11b by the adhesive material of the third spacer. In this condition, the third semiconductor element 19 is stored in the opening part of the third spacer, the third peripheral element 22 is inserted in the notch of the third spacer, and the fourth peripheral element 23 is inserted in the notch or the recess of the first spacer 31.

A multi-chip module (MCM) with a plurality of chips mounted thereon can be manufactured. This MCM is connected to the main substrate (not shown in the figure) by the connector terminal 32.

In accordance with the above-described first embodiment, a plurality of semiconductor elements 19–21 are COF-mounted on the FPC 11, the FPC 11 is folded, and thus, the mounting area can be considerably reduced compared with that of a prior art MCM. This means that, in a prior art MCM, a plurality of IC chips are mounted on a circuit substrate which cannot be folded, and the MCM cannot be reduced in size; however, in the present embodiment, a plurality of semiconductor elements are mounted on the foldable FPC 11, and the MCM can be considerably reduced in size as shown in FIG. 1(c). Thus, a super-high density mounting module can be manufactured.

Further, in the present embodiment, connection is made to the main substrate using the connector terminal 32, and thus, the MCM can be more easily connected to the main substrate than the prior art MCM. In addition, the connector terminal 32 can be easily attached/detached to/from the main substrate, and is excellent in re-workability compared with the prior art MCM.

Further, in the present embodiment, the peripheral element including a chip capacitor, a chip resistor and a quartz can be disposed in the vicinity of an IC chip mounted on the FPC 11. The electric characteristics of the module can thus be optimized. Also, since the chip capacitor, the quartz, etc. are disposed in the vicinity of the IC, the noise resistant performance can be improved, and in particular, unnecessary radiation noise can be suppressed. In addition, by disposing the above-described peripheral element on a folded portion of the FPC, the space of the folded portion formed by the folding can be effectively utilized, and the MCM can be reduced in size thereby.

Also, in the present embodiment, the semiconductor element is COF-mounted on the FPC 11, and thus, the thickness of the MCM shown in FIG. 1(c) can be reduced.

The present invention is not limited to the above-described embodiment, but can be realized in various manners. For example, the FPC having another shape can be used though the FPC 11 having a cross-shape in plan view is used in the present embodiment.

Further, in the present embodiment, the folding is made in the order of the second area part 11a, the third area part 11b and the fourth area part 11c in the FPC 11; however, the folding pattern is not limited thereto, and other folding is also possible. For example, the folding pattern can be appropriately changed according to the circuit pattern.

Still further, polyimide is used for a base material of the FPC 11; however, a base material formed of other material can be used so long as the material is foldable.

In the present embodiment, the SRAM is used for the first and second semiconductor elements 21, 20, and the MCU is used for the third semiconductor element 19; however, the design is not limited thereto, and any semiconductor elements of other kind can be used. For example, a flash memory, a DRAM, a memory, an ASIC or an MPU can be used.

Not only the IC chip but also various kinds of electronic parts can be mounted on the FPC 11 of the present embodiment.

In the present embodiment, the spacers 31, 33 of the structure that the adhesive material is attached to the base material such as the glass epoxy substrate are used in the present embodiment; however, the structure is not limited thereto, and any spacer of other materials or other structures can be used.

Figure 4A:
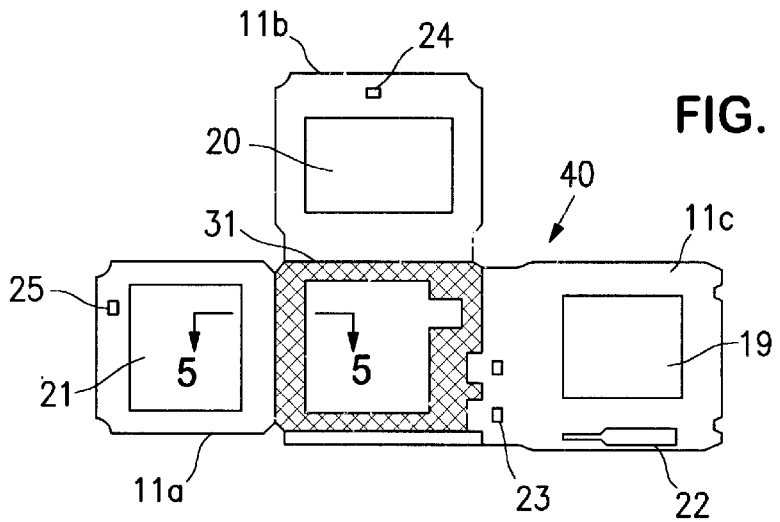
FIG. 4 is a top plan view showing a procedure to manufacture a semiconductor device of a second embodiment of the present invention.
Figure 4B:
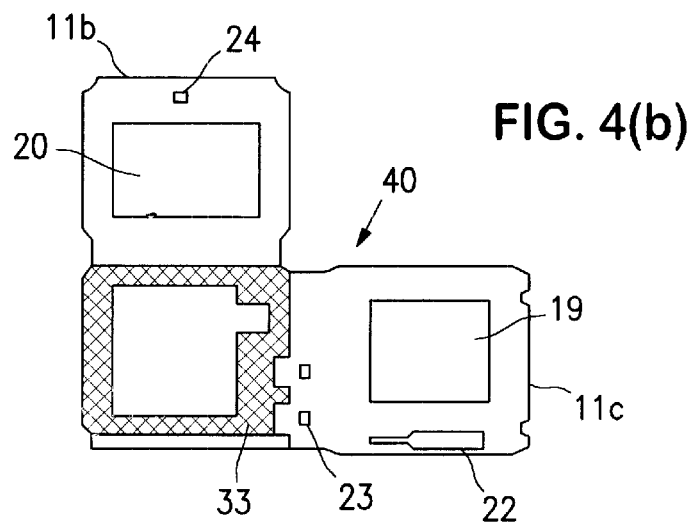
Figure 4C:
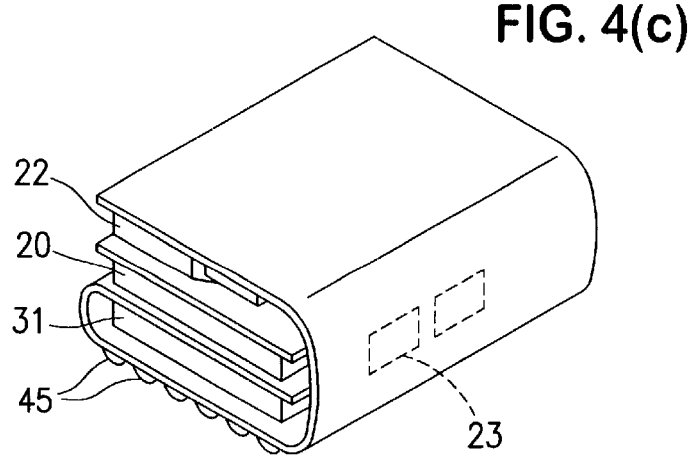

FIGS. 4(a)–(c) are top plan views to indicate the procedure of manufacturing a semiconductor device in accordance with the second embodiment of the present invention, and same symbols are given to the same parts as those in FIG. 1. FIG. 5 is a sectional view at the line 5—5 of FIG. 4(a). Description of the same parts as those in the first embodiment is omitted.

Firstly, a foldable FPC 40 is prepared as shown in FIG. 4(a). No fifth area part is continuously provided on the first area part of the FPC 40. The wiring pattern on the face side and the wiring pattern on the rear face of the polyimide film 12 are electrically connected to each other via a through hole 43. A solder ball 45 as a BGA terminal is provided on the wiring pattern 13 of the rear face of the first area part of the FPC 40.

Then, semiconductor elements 19–21 are mounted on the FPC 40, and the peripheral elements 22–25 are temporarily fixed to the FPC 40 by an adhesive material, and mounted by soldering. Subsequently, as shown in FIG. 5, the second area part 11a of the FPC 40 is folded to the face side of the first area part along the first side 51. An MCM shown in FIG. 4(c) is manufactured by successively folding the third area part 11b, and the fourth area part 11c. The peripheral element 23 is disposed on the surface of the FPC provided with the wiring pattern, and in FIG. 4(c), the point at which the peripheral element 23 is disposed on a folded portion of the FPC 40 is indicated on the rear face side of the FPC for convenience of the description.

Then, this MCM is mounted on the main substrate (not shown in the figure) and reflow is achieved to solder the BGA terminal (solder ball) 45 on the rear side of the first area part on the main substrate. The MCM is thus mounted on the main substrate. The spacers 31, 33 to be used must withstand the reflow temperature.

Also in the second embodiment, the mounting area can be considerably reduced similar to the first embodiment, and more specifically, the mounting area can be reduced to about ⅕.

Further, in the present embodiment, the module can be optimized similar to the first embodiment, and the noise resistant performance can be improved.

Still further, in the present embodiment, the thickness of the MCM shown in FIG. 4(c) can be reduced since the semiconductor element is COF-mounted on the FPC 11.

As described above, in the present invention, the second area part is provided to mount at least one electronic parts, the second area part is folded to the first area part side, and the third area part is folded to the second area part side. A flexible printed circuit capable of considerably reducing the mounting area when the semiconductor element is mounted can thus be provided.

Further in the present invention, the semiconductor element is mounted on the flexible printed circuit, and the flexible printed circuit is folded. Thus, the semiconductor device whose mounting area can be considerably reduced can be provided.

The present invention further includes the connector terminal which is continuously provided on the first area part and connected to the main substrate. The flexible printed circuit excellent in re-workability and the semiconductor device can be provided.

What is claimed is:

1. A semi-conductor device, comprising:

a flexible printed circuit having a first area part, a second area part provided continuous thereto, and a third area part provided continuous to the first area part;

a wiring pattern formed on a surface of said flexible printed circuit;

an electronic part mounted on at least one of said second area part and said third area part, wherein said second area part is adapted to be folded to a face side of said first area part, and said third area part is adapted to be folded to a face side of said second area part, and a spacer mounted on either between said first area part and said second area part or between said second area part and said third area part for binding corresponding area parts, said spacer having an opening area for receiving said electronic part therein.

2. A semiconductor device according to claim 1, further including a peripheral element mounted on at least one face side of said second area part and said third area part.

3. A semiconductor device according to one of claims 1 and 2, further including a connector terminal which is provided continuous to said first area part and connected on a main substrate.

4. A semiconductor device according to one of claims 1 and 2, further including an external terminal provided on a rear side of said first area part.

5. A semiconductor device according to claim 1, wherein a face side of said first area part is fixed to a face side of said second area part by an adhesive material, and a rear side of said second area part is fixed to a face side of said third area part by an adhesive material.

6. A semiconductor device according to claim 2, wherein at least one of said second area part and said third area part is provided with a folded portion folded to a face side of said first area part, and said peripheral element is disposed on said folded portion.

7. A semiconductor device according to claim 5, wherein the adhesive material is adhesive double coated tape.

* * * * *